United States Patent [19]
Sago et al.

[11] Patent Number: 5,571,324
[45] Date of Patent: Nov. 5, 1996

[54] ROTARY-CUP COATING APPARATUS

[75] Inventors: Hiroyoshi Sago; Hideyuki Mizuki; Katsuhiko Kudo, all of Kanagawa, Japan

[73] Assignee: Tokyo Ohka Kogyo Co., Ltd., Kanagawa, Japan

[21] Appl. No.: 277,903

[22] Filed: Jul. 20, 1994

[30] Foreign Application Priority Data

Jul. 26, 1993 [JP] Japan ..................... 5-183703

[51] Int. Cl.⁶ .................................................. B05B 13/04
[52] U.S. Cl. ............................................ 118/320; 118/503
[58] Field of Search ........................... 118/52, 326, 501, 118/503, 320, 319; 427/240, 241, 231

[56] References Cited

U.S. PATENT DOCUMENTS 3,993,018  11/1976  Kranik et al. .................. 118/52

FOREIGN PATENT DOCUMENTS 3293056  12/1991  Japan .

*Primary Examiner*—Donald E. Czaja
*Assistant Examiner*—Calvin Padgett
*Attorney, Agent, or Firm*—Rosen, Dainow & Jacobs Limited Liability Partnership

[57] ABSTRACT

When a cylinder unit is actuated to extent its rod upwardly, a chuck is lifted above an inner cup to receive a planar workpiece such as a semiconductor wafer or a glass substrate. The chuck is now disengaged from the inner cup, and a stopper locks the chuck against rotation. After the planar workpiece has been supported on the chuck, the cylinder unit is actuated to retract its rod, bringing the chuck into its lowered position. The chuck is now engaged by the inner cup for corotation. Energization of a motor rotates the inner cup, which then rotates the chuck. Since the inner cup, which has a relatively large rotational inertia, is driven by the motor, interengaging portions of the inner cup and the chuck are less susceptible to damage.

9 Claims, 3 Drawing Sheets

ROTARY-CUP COATING APPARATUS

BACKGROUND OF THE INVENTION

1. Field of the Invention

The present invention relates to a rotary-cup coating apparatus for uniformly coating a coating solution on a surface of a planar workpiece such as a semiconductor wafer or a glass substrate.

2. Description of the Prior Art

Fabrication processes for forming devices on semiconductor wafers, glass substrates, or the like employ coating apparatus for coating or applying a coating solution on such planar workpieces.

One conventional coating apparatus includes a rotary spinner chuck disposed in a fixed cup for attracting a planar workpiece such as a semiconductor wafer on an upper surface thereof. While the planar workpiece is being attracted to the spinner chuck, a coating solution drops from a nozzle onto the upper surface of the planar workpiece, and the spinner chuck is rotated by a motor to spread the coating solution uniformly over the upper surface of the planar workpiece under centrifugal forces.

Since the cup is fixed in place and the spinner chuck rotates, turbulent air flows tend to be produced in the fixed cup. When such turbulent air flows are generated in the cup, they prevent the coating solution from being applied uniformly to the upper surface of the planar workpiece, and allow fine dust particles to be attached to the upper surface of the planar workpiece.

Japanese laid-open patent publication No. 3-293056 discloses a rotary-cup coating apparatus having a rotary cup assembly. The rotary cup assembly comprises a rotatable inner cup and a fixed outer cup disposed around the rotatable inner cup. A vacuum chuck for holding a workpiece thereon is mounted centrally in the rotatable inner cup for rotation therewith.

FIG. 3 of the accompanying drawings shows an improvement of the rotary-cup coating apparatus disclosed in the above publication. As shown in FIG. 3, the improved rotary-cup coating apparatus has a base 100, an inner cup 101 rotatably supported on the base 100, and an outer cup 102 fixed to the base 100 around the inner cup 101. The inner cup 101 has drain pipes 103 (one shown) projecting from an outer circumferential surface thereof radially outwardly into the outer cup 102. A chuck 105 which can be rotated by a motor 104 is disposed in a central opening defined in the bottom of the inner cup 101. The chuck 105 is vertically movable by a cylinder unit 106. When the chuck 105 is in an elevated position, it receives a semiconductor wafer. When the chuck 105 is in a lowered position as shown in FIG. 3, the chuck 105 engages the inner cup 101 through interengaging portions 107 for rotation therewith. In the lowered position, the chuck 105 and hence the inner cup 101 are rotated by the motor 104, and a coating solution applied to the upper surface of the semiconductor wafer is spread uniformly thereover under centrifugal forces.

In operation, the rotary force of the motor 104 is transmitted from the chuck 105 to the inner cup 101. The inner cup 101 has a larger diameter and a larger mass than the chuck 105. Therefore, when the inner cup 101 starts being rotated through the chuck 105 by the motor 104, the chuck 105 and the inner cup 101 cannot reach a desired rotational speed quickly. When the motor 104 is de-energized to stop rotating the chuck 105, since the rotational inertia of the inner cup 101 is very large, the interengaging portions 107 are subject to a large burden. Consequently, when the chuck 105 is repeatedly stopped, the interengaging portions 107 will eventually be broken.

SUMMARY OF THE INVENTION

It is therefore an object of the present invention to provide a rotary-cup coating apparatus which is less susceptible to failures or damage in operation.

According to the present invention, there is provided a rotary-cup coating apparatus comprising a base, a inner cup rotatably mounted on said base, an outer cup fixedly mounted on the base and extending around the inner cup, a chuck vertically movably disposed centrally in the inner cup for supporting a workpiece to be coated, a motor for rotating the inner cup, and interengaging means on the inner cup and the chuck for engaging the inner cup and the chuck with each other, whereby the chuck can be rotated through the inner cup by the motor.

According to the present invention, there is also provided a rotary-cup coating apparatus comprising a rotatable inner cup, a fixed outer cup disposed around the inner cup, a chuck vertically movably disposed centrally in the inner cup for supporting a workpiece to be coated, interengaging means for interengaging the rotatable inner cup and the chuck for corotation, and means for rotating the rotatable inner cup.

The rotary-cup coating apparatus may further comprise means for vertically moving the chuck between an elevated position to receive a workpiece on the chuck and a lowered position to allow the inner cup and the chuck to be engaged by the interengaging means, and means for locking the chuck against rotation when the chuck is in the elevated position.

The interengaging means may comprise a recess defined in the chuck and a tooth disposed on the inner cup.

The above and further objects, details and advantages of the present invention will become apparent from the following detailed description of a preferred embodiment thereof, when read in conjunction with the accompanying drawings.

DETAILED DESCRIPTION OF THE PREFERRED EMBODIMENT

Figure 1:
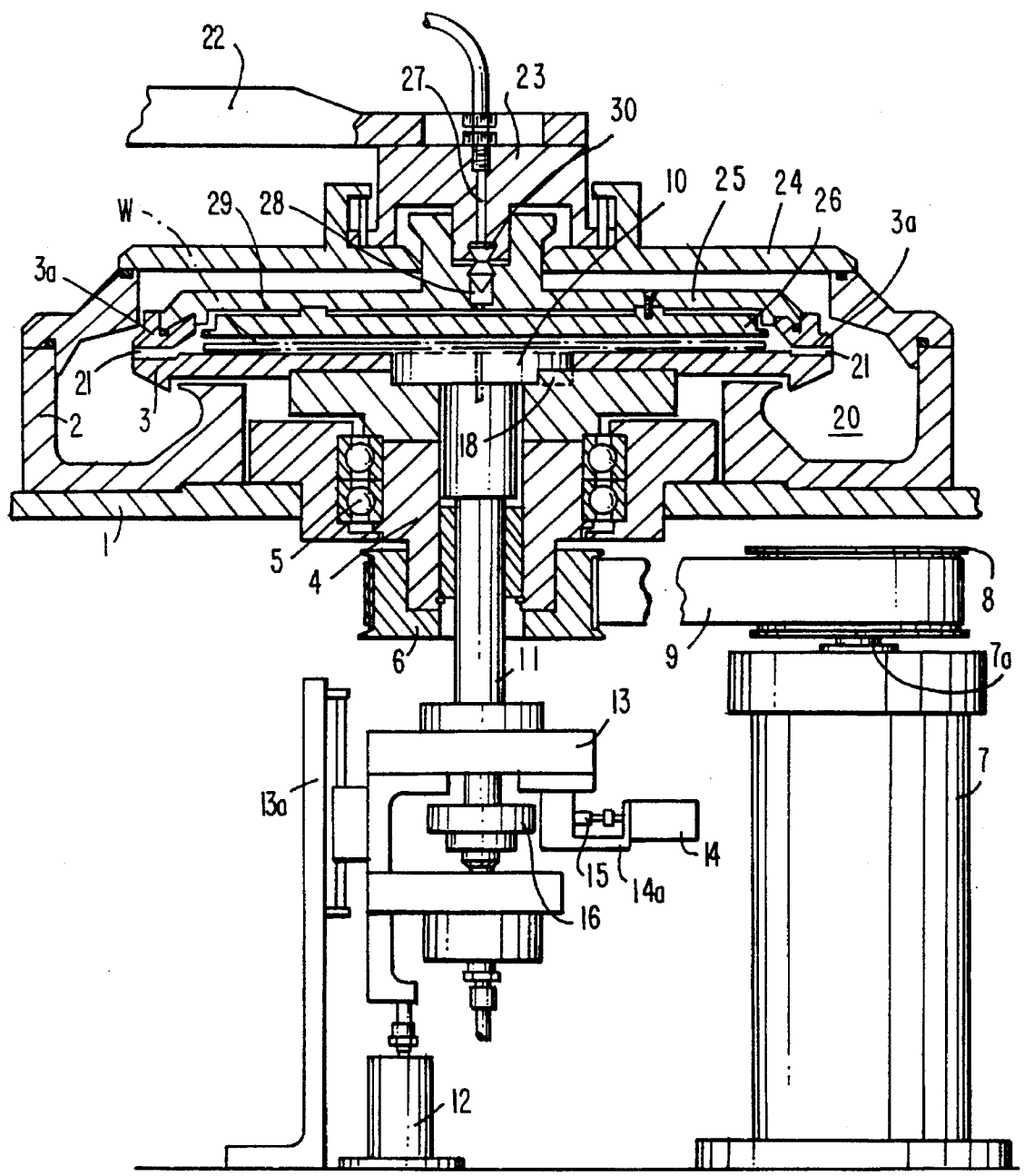
FIG. 1 is a fragmentary vertical cross-sectional view of a rotary-cup coating apparatus according to the present invention.

As shown in FIG. 1, a rotary-cup coating apparatus according to the present invention has a base 1, an annular outer cup 2 fixedly mounted on the base 1, and a rotatable inner cup 3 rotatably disposed in the outer cup 2. Each cup has sides and a bottom or lower surface. The inner cup 3 has a tubular shaft 4 extending downwardly and rotatably supported on the base 1 by a bearing 5.

The tubular shaft 4 has a lower end positioned below the base 1 and supporting a pulley 6 fitted thereover. A motor 7 mounted on a foundation spaced downwardly from the base 1 has a rotatable shaft 7a on which a pulley 8 is fixedly mounted. An endless belt 9 is trained around the pulleys 6, 8 so that the inner cup 3 can be rotated directly by the motor 7 through the endless belt 9 when the motor 7 is energized.

The inner cup 3 has a central opening defined therein which houses a chuck 10 disposed therein. The chuck 10 has a shaft 11 extending downwardly through the tubular shaft 4 and having lower end rotatably supported on a lifter 13 which can be vertically moved by a vertical cylinder unit 12 placed on the foundation. The lifter 13 is guided for vertical movement by a guide post 13a mounted on the foundation. A horizontal cylinder unit 14 is connected to the lifter 13 by a bracket 14a. When the horizontal cylinder unit 14 is actuated to extend its rod, a stopper 15 mounted on the rod of the horizontal cylinder unit 14 projects through the bracket 14a into a hole 17 defined in a large-diameter portion 16 of the shaft 11, thus locking the shaft 11 and hence the chuck 10 in a predetermined angular position against rotation.

Figure 2:
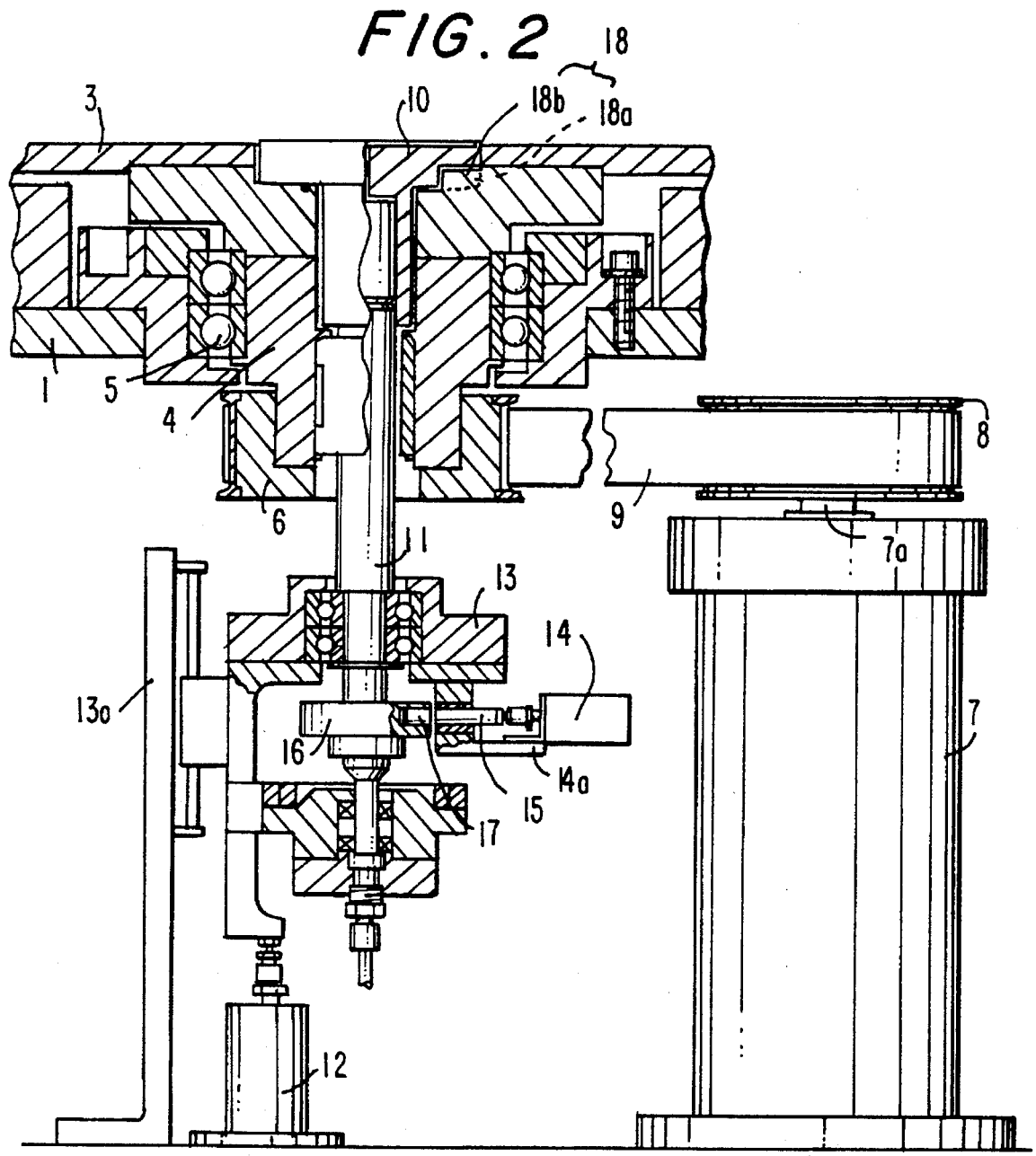
FIG. 2 is an enlarged fragmentary vertical cross-sectional view of the rotary-cup coating apparatus shown in FIG. 1.
Figure 3:
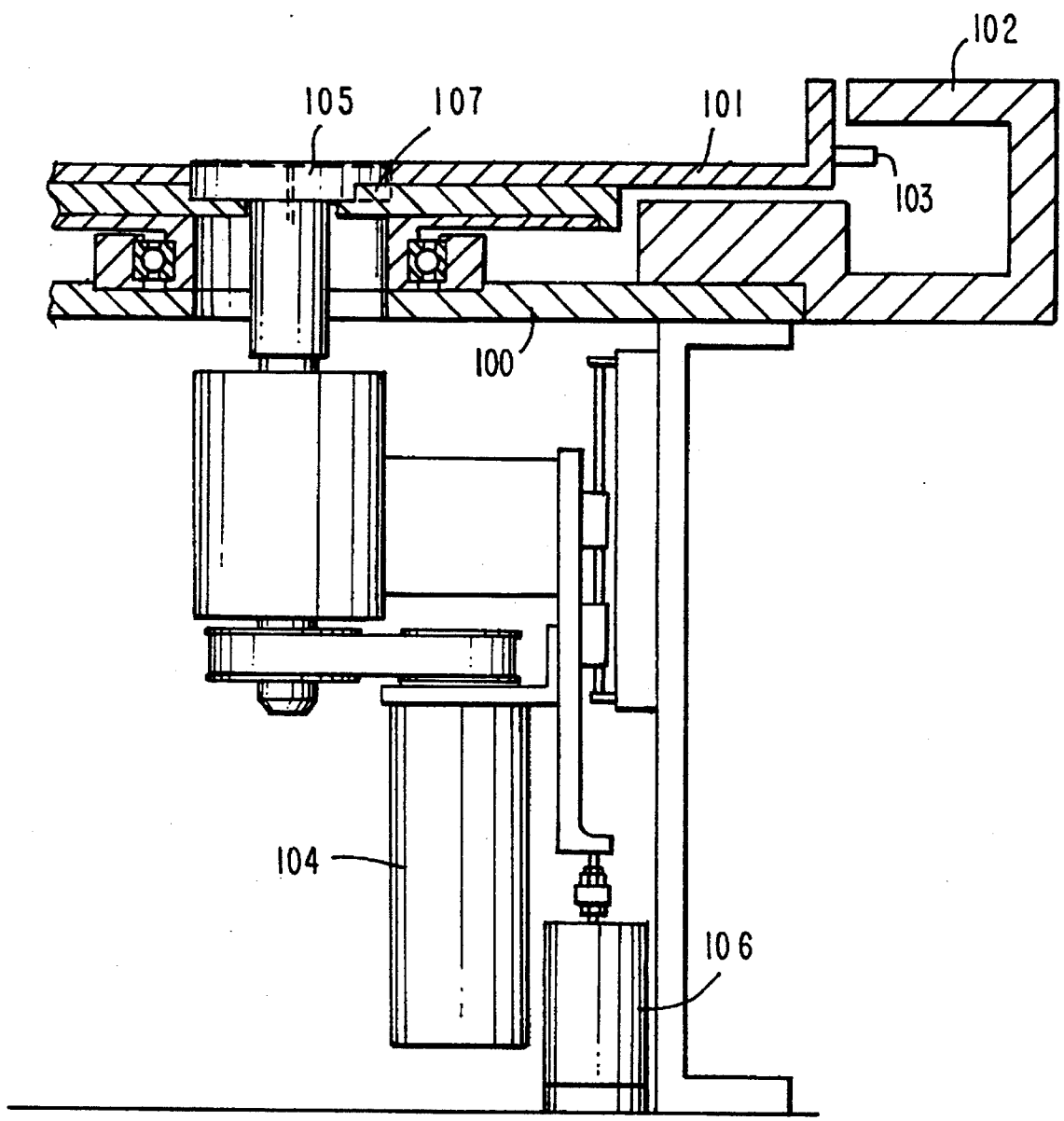
FIG. 3 is a fragmentary vertical cross-sectional view of a conventional rotary-cup coating apparatus.

The chuck 10 and the inner cup 3 are engageable for transmitting rotary forces therebetween by interengaging portions 18. As shown in FIG. 2, the interengaging portions 18 comprise a recess 18a defined in the chuck 10 and a tooth 18b on the inner cup 3 which can engage in the recess. When the cylinder unit 12 is actuated to extend its rod upwardly, the upper chuck 10 is lifted above the upper surface of the inner cup 3. When the upper chuck 10 is in an elevated position, it can receive or transfer a planar workpiece W such as a semiconductor wafer, a glass substrate, or the like. In the elevated position, the interengaging portions 18 disengage from each other, and the stopper 15 is inserted in the hole 17, with the chuck 10 not rotating. When the cylinder unit 12 is actuated to retract its rod, the chuck 10 is lowered toward the inner cup 3. When the chuck 10 is in a lowered position as shown in FIG. 1, the interengaging portions 18 engage each other, allowing rotary forces from the inner cup 3 to be transmitted to the chuck 10.

The inner cup 3 has an upwardly open recess defined in its upper surface. The upwardly open recess is held in communication with a coating solution retrieval passage 20 defined in the annular outer cup 2 through communication holes 21 which are defined radially in an outer circumferential wall 3a of the inner cup 3. The communication holes 21 serve to bleed air and drain a coating solution from the inner cup 3 into the coating solution retrieval passage 20.

Above the outer cup 2 and the inner cup 3, there is disposed an arm 22 which is linearly, angularly, or vertically movable, or linearly, angularly, and vertically movable. The arm 22 supports on its distal end an outer cup lid 24 through a block 23 that is attached to a lower surface of the distal end of the arm 22. When the arm 22 is lowered, the outer cup lid 24 is placed on the upper end of the outer cup 2, thus closing the inner space of the outer cup 2. The outer cup lid 24 supports an inner cup lid 25 positioned therebelow for closing the inner space of the inner cup 3. A flow rectifying plate 26 is fastened to the lower surface of the inner cup lid 25.

The block 23 has a cleaning solution supply passage 27 defined vertically therein. The inner cup lid 25 has a cleaning solution/air passage 28 defined centrally therein. A gap 29 which is defined between the inner cup 3 and the flow rectifying plate 26 is held in communication with the cleaning solution/air passage 28 and opens toward an inner circumferential wall of the inner cup 3 in communication with the communication holes 21. The block 23 supports on its lower end a valve 30 which selectively opens and closes the cleaning solution/air passage 28 when the block 23 moves upwardly and downwardly.

The rotary-cup coating apparatus operates as follows: In order to apply a coating solution to the upper surface of a planar workpiece W, the arm 22 is lifted to elevate the outer cup lid 24 and the inner cup lid 25 for thereby opening the outer cup 2 and the inner cup 3 respectively. Then, the chuck 10 is lifted by the cylinder unit 12 to the elevated position higher than the upper end of the inner cup 3. Thereafter, the planar workpiece W is placed on the chuck 10, and a vacuum is developed in the chuck to attract the planar workpiece W to the upper surface of the chuck 10.

The chuck 10 is then lowered into the lowered position by the cylinder unit 12, the interengaging portions 18 engage each other, so that the inner cup 3 and the chuck 10 can rotate with each other. A coating solution is dropped onto the upper surface of the planar workpiece W. The arm 22 is thereafter lowered to close the upper end of the inner cup 3 with the inner cup lid 25 and then close the upper end of the outer cup 2 with the outer cup lid 25.

Subsequently, the motor 7 is energized to rotate the inner cup 3 and hence the chuck 10. As a result, the coating solution on the upper surface of the planar workpiece W is spread uniformly over the upper surface of the planar workpiece W under centrifugal forces. Therefore, the upper surface of the planar workpiece W is uniformly coated with the coating solution.

After the planar workpiece W has been coated, the arm 22 is slightly lifted to open the valve 30, allowing air to be introduced from the passage 28 and the gap 28 into the inner cap 3 from its outer circumferential region. The coated planar workpiece W is now released from the chuck 10. Then, the arm 22 is further lifted to elevate the outer cup lid 24 and the inner cup lid 25 for thereby opening the outer cup 2 and the inner cup 3, respectively. The chuck 10 is elevated by the cylinder unit 12, and the coated planar workpiece W is removed from the chuck 10.

During operation of the rotary-cup coating apparatus, the rotary forces from the motor 7 are not directly applied to the chuck 10, but transmitted to the inner cup 3 having a relatively large rotational inertia, from which the rotary forces are transmitted to the chuck 10 through the interengaging portions 18. Therefore, even when the inner cup 3 is stopped abruptly, any burden on the interengaging portions 18 and the motor 7 is relatively small. The rotary-cup coating apparatus is thus less susceptible to failures or damage in operation.

Although there has been described what is at present considered to be the preferred embodiment of the invention, it will be understood that the invention may be embodied in other specific forms without departing from the essential characteristics thereof. The present embodiment is therefore to be considered in all respects as illustrative, and not restrictive. The scope of the invention is indicated by the appended claims rather than by the foregoing description.

What is claimed is:

1. A rotary-cup coating apparatus for applying a coating solution on a surface of a workpiece comprising:

a base;

an inner cup rotatably mounted on said base, said inner cup, having a lower surface and having a cylindrical shaft extending downwardly, an outer cup fixedly mounted on said base and extending around said inner cup;

a chuck vertically movably disposed centrally in said inner cup for supporting a workpiece to be coated; said chuck having a shaft extending downwardly through said cylindrical shaft of said inner cup; said cylindrical shaft having an upper end connected to the lower surface of said inner cup around said chuck;

a motor operatively connected with said cylindrical shaft for rotating said inner cup;

interengaging means on said inner cup and said chuck for engaging said inner cup and said chuck in communication with each other, whereby said chuck can be rotated through said inner cup by said motor; and means for applying a coating solution onto the surface of the workpiece while it is supported and rotated by said chuck.

2. A rotary-cup coating apparatus according to claim 1, further comprising means for vertically moving said chuck between an elevated position to receive a workpiece on the chuck and a lowered position to allow said inner cup and said chuck to be engaged by said interengaging means.

3. A rotary-cup coating apparatus according to claim 2, further comprising means for locking said chuck against rotation when the chuck is in said elevated position.

4. A rotary-cup coating apparatus according to claim 1, wherein said interengaging means comprises a recess defined in said chuck and a tooth disposed on said inner cup.

5. A rotary-cup coating apparatus for applying a coating solution on a surface of a workpiece comprising:

a base an inner cup;

a fixed outer cup disposed around said inner cup, said inner cup having a lower surface and having an cylindrical shaft extending downwardly, a chuck vertically movably disposed centrally in said inner cup for supporting a workpiece to be coated; said chuck having a shaft extending downwardly through said cylindrical shaft of said inner cup; said cylindrical shaft having an upper end connected to the lower surface of said inner cup around said chuck;

interengaging means for interengaging said rotatable inner cup and said chuck for corotation; and means operatively connected with said cylindrical shaft for rotating said rotatable inner cup.

6. A rotary-cup coating apparatus according to claim 5, further comprising means for vertically moving said chuck between an elevated position to receive a workpiece on the chuck and a lowered position to allow said inner cup and said chuck to be engaged by said interengaging means.

7. A rotary-cup coating apparatus according to claim 6, further comprising means for locking said chuck against rotation when the chuck is in said elevated position.

8. A rotary-cup coating apparatus according to claim 5, wherein said interengaging means comprises a recess defined in said chuck and a tooth disposed on said inner cup.

9. A rotary-cup coating apparatus for applying a coating solution on a surface of a workpiece comprising:

a base;

an inner cup having walls defining an upwardly facing recess and a centrally located downward extending cylindrical shaft rotatably mounted to said base;

an outer cup fixedly mounted on said base and having walls defining an upwardly facing recess extending around said inner cup;

a chuck vertically movably disposed centrally in said inner cup for receiving and releasably supporting a workpiece to be coated: said chuck having a shaft extending downwardly through said cylindrical shaft of said inner cup;

a motor operatively connected with said cylindrical shaft for rotating said inner cup;

means for selectively coupling said inner cup and said chuck with each other, whereby said chuck can be rotated through said inner cup by said motor when said inner cup and said chuck are coupled together, means for moving said chuck vertically between a first position whereby the inner cup and chuck are coupled for rotation together and a second position whereby said inner cup and said chuck are decoupled to not rotate together, and means for applying a coating solution onto the surface of the workpiece while it is supported and rotated by said chuck.

* * * * *